US006697445B1

(12) United States Patent  (10) Patent No.: US 6,697,445 B1
Wong  (45) Date of Patent: Feb. 24, 2004

(54) METHOD AND APPARATUS WITH ENHANCED JITTER TRANSFER CHARACTERISTICS IN A PHASE-LOCKED LOOP SYSTEM

(75) Inventor: Hee Wong, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 356 days.

(21) Appl. No.: 09/865,193

(22) Filed: May 24, 2001

(51) Int. Cl.⁷ ................................................ H03D 3/24
(52) U.S. Cl. ..................................................... 375/376
(58) Field of Search ................................ 375/371, 373, 375/376, 354; 370/516–519; 327/146, 147, 155, 156

(56) References Cited

U.S. PATENT DOCUMENTS

| 3,878,473 | A | * | 4/1975 | Furtney, Jr. ................. 331/1 A |
| 5,351,275 | A | | 9/1994 | Wong et al. ................. 375/120 |
| 6,018,556 | A | * | 1/2000 | Janesch et al. ............. 375/376 |
| 6,590,950 | B1 | * | 7/2003 | Mycynek ..................... 375/376 |

OTHER PUBLICATIONS

"Clock Recovery and Data Retiming Phase–Locked Loop," *Analog Devices*, p. 1–12, Dec. 1993.
"SST™ SONET/SDH Serial Transceiver," *CYPRESS Preliminary*, p. 1–10, Oct. 1997.
"Fiber Optic Receiver with Quantizer and Clock Recovery and Data Retiming," *Analog Devices*, p. 1–12, Jan. 1998.
"SONET/SDH/ATM OC–12 Clock Recovering Transceiver," *SYNERGY Semiconductor*, p. 618–627, May 1998.
"SONET/SDH/ATM OC–12 Clock Recovering Transceiver," *SYNERGY Semiconductor*, p. 628–637, May 1998.
"2.5 Gbps, Low–Power, +3.3V Clock Recovery and Data Retiming IC," *MAXIM*, 8 pages, Oct. 1998.
"622 Mbps, Low–Power, 3.3V Clock–Recovery and Data–Retiming IC with Limiting Amplifier," *MAXIM*, 16 pages, Nov. 1998.
"OC48/STM16 Demux/CDR with Differential Input", TQ48/STM16 Preliminary Data Sheet, p. 1–20, Jun. 1999.
"Multi–Rate Sonet/SDH Clock Recovery Unit", AMCC, S3050, p. 1–17, Jul. 9, 1999.
"+3.3V, 2.488Gbps, SDH/Sonet 1:16 Deserializer with Clock Recovery", Maxim Integrated Products, Max3880, 19–1467; Rev 1; p. 1–12, Dec. 1999.
"Fiber Optic receiver with Quantizer and Clock Recovery and Data Retiming", Analog Devices, AD807, Rev B, C00862–0, p. 1–12, Dec. 2000.
"622Mpbs, 3.3V Clock–Recovery and Data–Retiming IC with Limiting Amplifier", Maxim Integrated Products Max3676, 19–1537, Rev 1 4/00 p. 1–16.
"Sonet/SDH Clock Recovery Unit", AMCC, S3040A Revision D p. 1–13, Apr. 4, 2000.
"Sonet/SDH Clock Recovery Unit", AMCC, S3040B Revision NC, p. 1–13, Apr. 6, 2000.
"STS–12/STS–3 Multi Rate Clock and Data Recovery Unit", Vitesse Semiconductor Corporation, VSC8115, G52272–0, Rev 1.1, p. 1–12, Sep. 29, 2000.
"Multi–Rate Sonet/SDH Clock and Data Recovery IC", Vitesse Semiconductor Corporation, VSC8122, G52228–0, Rev 4.1, p. 1–14 Jan. 5, 2001.

* cited by examiner

*Primary Examiner*—Tesfaldet Bocure
(74) *Attorney, Agent, or Firm*—Brett A. Hertzberg; Merchant & Gould

(57) ABSTRACT

A method and apparatus are directed to improving the response of a phase-locked loop (PLL) by reducing the jitter transfer characteristics. A new PLL system, referred to as an IS-PLL, includes an integrator and stability filter that are arranged to provide improved low frequency and high frequency performance while maintaining reduced jitter. The design of the IS-PLL is accomplished using superposition such that the integrator and stability filter designs are simplified. Design coefficients are chosen such that the system transfer function has a high frequency roll-off that is equivalent to a second order low-pass filter. Other design coefficients are chosen such that the system transfer function provides for improved DC tracking and reduced jitter when tracking peaks in an error signal. The IS-PLL has a third order system transfer function that can be realized with simplified design criteria.

20 Claims, 7 Drawing Sheets

//METHOD AND APPARATUS WITH ENHANCED JITTER TRANSFER CHARACTERISTICS IN A PHASE-LOCKED LOOP SYSTEM

FIELD OF THE INVENTION

The present invention relates to electronic circuits that utilize phase-locked loop technology. In particular, the present invention relates to a method and apparatus for a phased-locked loop device that provides for enhanced jitter transfer characteristics.

BACKGROUND OF THE INVENTION

Control systems can be categorized as open-loop or closed-loop systems. Open-loop control systems are often used in sequence control systems to guide a process through a sequence of predetermined steps. However, open-loop control systems do not yield high performance, due to errors between the input and output signals. These differences ("errors") can result from disturbances acting on the system, variations of parameters in the system, and the like.

A closed-looped system, also termed a feedback control system, utilizes a feedback loop that allows the system to take corrective action in response to the "error" signal. Generally, closed-loop systems compare the amplitude of the input signal to that of the output signal with the result being the "error" signal. If the control system is functioning properly the "error" signal will ideally be zero.

In one electronic system, a closed-loop system may be employed to synchronize an internal clock signal with an external clock signal. In another electronic system, a closed-loop system may be employed to modulate and demodulate data transmission signals. In these types of electronic systems, a specific type of closed-loop system referred to as a phase-locked loop (PLL) is often employed.

A phase-locked loop (PLL) system generates an error signal by comparing the phase of the input signal to the phase of the output signal. The PLL is said to be "locked" when the phase difference (error signal) is within some minimum and maximum phase range. PLL systems are very useful in high noise environments.

Unwanted phase movement is known as "Jitter", and can be determined as the range of variation of the magnitude of the phase difference between the input signal and the output signal (the "error signal"). Jitter peaking is the amount of overshoot in the error signal. A "transfer function" describes the input to output transfer characteristics of a PLL system and is similar to a low-pass filter response.

BRIEF SUMMARY OF THE INVENTION

The present invention is directed to a method and apparatus for improving the response of a phase-locked loop (PLL) by reducing the jitter transfer characteristics. A new PLL system, referred to as an IS-PLL, includes an integrator and stability filter that are arranged to provide improved low frequency and high frequency performance while maintaining reduced jitter. The design of the IS-PLL is accomplished using superposition such that the integrator and stability filter designs are simplified. Design coefficients are chosen such that the system transfer function has a high frequency roll-off that is equivalent to a second order low-pass filter. Other design coefficients are chosen such that the system transfer function provides for improved DC tracking and reduced jitter. The present invention results in a third order system transfer function that can be realized with simplified design criteria.

In accordance with the invention, an apparatus for reducing jitter in a phase-locked loop that includes a phase detector circuit for producing an error signal in response to a phase difference between an input signal and a feedback signal is provided. A composite filter for producing a composite signal in response to the phase difference is also provided. The composite filter also includes an integrator and a stability filter. A gain circuit is provided that is arranged to produce an output signal in response to the composite signal. The output signal corresponds to a scaled version of the composite signal. An oscillator is provided for producing an oscillator signal in response to the output signal. The oscillator signal includes a corresponding phase that is employed as the feedback signal to the phase detector so that jitter in the output signal is reduced.

In accordance with an embodiment of the present invention, an IS-PLL includes a gain circuit, an integrator, and a stability filter. The IS-PLL has a system transfer function that is defined by three parameters ($f_K$, $f_I$, $f_S$). The IS-PLL system has a filter parameter ($f_K$) that corresponds to a product of each gain associated with the integrator, the stability filter, and the gain circuit. The filter parameter $f_S$ represents the stability filter, while another filter parameter $f_I$ represents the integrator. The ratio of $f_K/f_I$ is in a range from about 32 to about 512. Also, the ratio of $f_S/f_K$ is in a range from about 2 to about 5. The chosen parameters ($f_K$, $f_I$, $f_S$) provide for reduced jitter peaking in the system transfer function. The system transfer function of the IS-PLL may be described as: $H(s)=(s \cdot f_K \cdot \{f_S+f_I\}+f_K \cdot f_S \cdot f_I)/(S^3+S^2 \cdot f_S+s \cdot f_K \{f_S+f_I\}+f_K \cdot f_S \cdot f_I)$.

In another embodiment of the present invention, a method is directed to providing a phase-locked loop system that includes the functionality of the embodiments of the invention discussed above and below.

These and other features as well as advantages, which characterize the invention, will be apparent from a reading of the following detailed description and a review of the associated drawings.

DETAILED DESCRIPTION OF THE INVENTION

Figure 1:
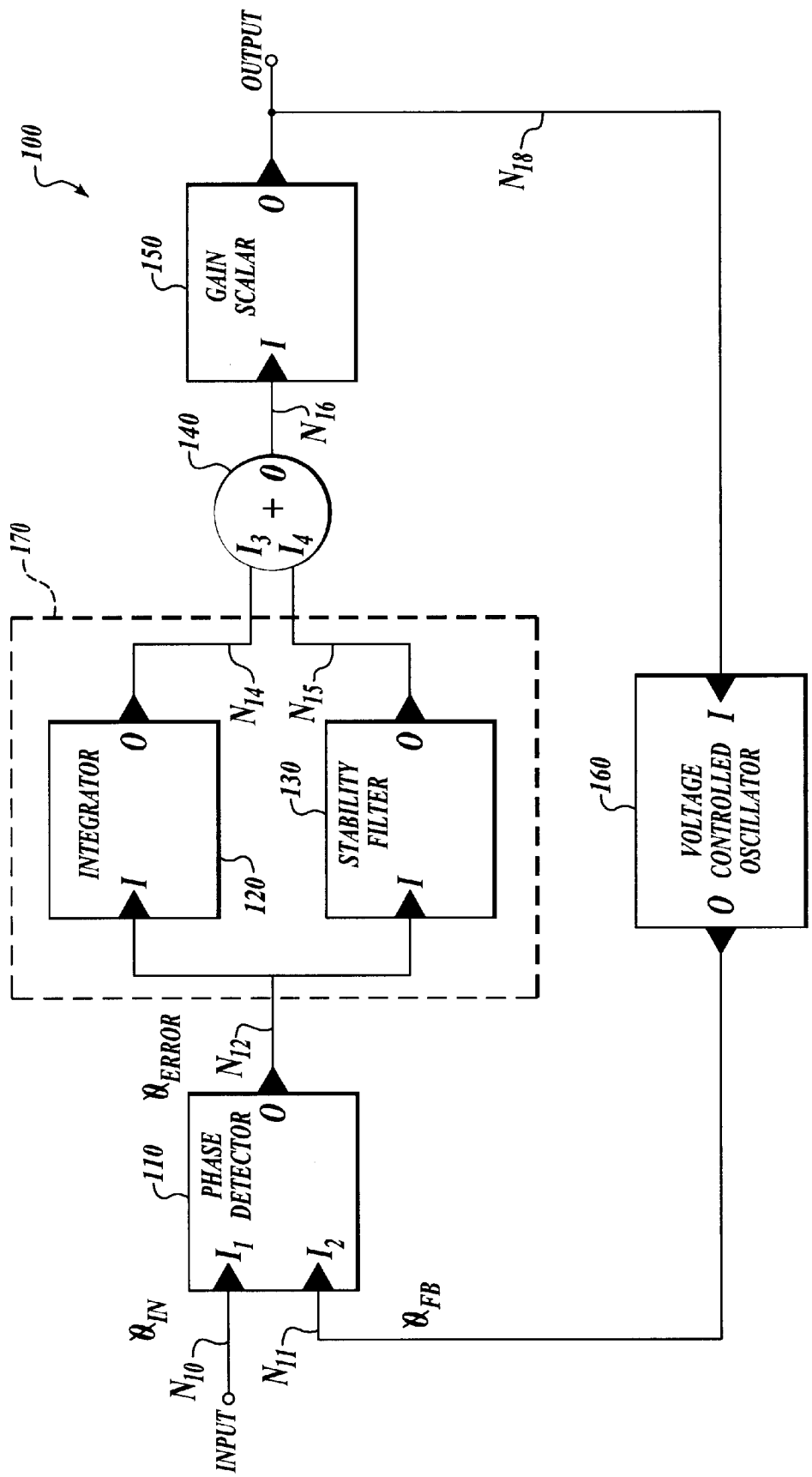
FIG. 1 is a system diagram illustrating an example of a phase-locked loop system with enhanced jitter transfer characteristics that is in accordance with the present invention.

Throughout the specification, and in the claims, the term "connected" means a direct electrical connection between the things that are that is connected, without any intermediary devices. The term "coupled" means either a direct electrical connection between the things that are that is connected, or an indirect connection through one or more passive or active intermediary devices. The term "circuit" means one or more passive and/or active components that are arranged to cooperate with one another to provide a desired function. The term "signal" means at least one current signal, voltage signal, data signal, amplitude signal, or phase signal.

The present invention relates to electronic circuits that utilize phase-locked loop technology. More particularly, the present invention relates to a method and apparatus for a phased-locked loop (PLL) system with enhanced jitter transfer characteristics. However, the present invention has determined that a need exists for a filter topology that can reduce jitter transfer characteristics while maintaining acceptably high roll-offs.

If the PLL possesses a poor jitter transfer characteristic, the output of the PLL may have undesirable phase variations. If the application requires cascading several of these PLLs, such as in the SONET line-timing mode, the "jitter leak-through" will create severe jitter accumulation problems due to the line-timing mode using the recovered clock for transmission, and the last PLL seeing the accumulated jitter from all of the previous transmitters.

For clock-multiplying synthesizers, the reference clock jitter, including jitter from other sources, such as charge-pump phase detectors, will also pass through the PLL. Thus, the "jitter leak-through" will create jitter at the output of the PLL. The output jitter spectrum will usually have a high frequency response similar to filter transfer characteristics. Therefore, good jitter transfer characteristics are essential when designing PLLs.

An ideal PLL response should have a brick-wall, low-pass filter transfer characteristic. Within the pass-band, the gain should be unity; outside the pass-band, the gain should be zero. With this kind of transfer characteristic, the PLL should track all low frequency variations and reject all high frequency input jitters at its output.

One method of determining the extent of jitter is a criterion known as damping factor ($\zeta$). The damping factor ($\zeta$) is a measurement of reduction in gain of the system, also known as stability. Generally, a larger damping factor ($\zeta$) will result in improved stability. Common values for $\zeta$ range from 0.707 to 20.

The present invention approaches these ideal characteristics as a third-order transfer characteristic that includes an integrator for tracking low frequency changes and a separate low-pass filter for controlling the loop stability and high-frequency attenuation. These two filter elements, the "integrator" and the "stability filter," (IS) together with other system components form a new type of PLL system hereinafter referred to as an IS-PLL.

FIG. 1 is a system diagram illustrating an example of a phase-locked loop system (100) with enhanced jitter transfer characteristics that is in accordance with the present invention. In FIG. 1, the phase-locked loop system (100) includes a phase detector (110), a summer (140), a gain scalar (150), a voltage controlled oscillator (160), and a composite filter (170). The composite filter (170) includes an integrator (120) and a stability filter (130).

Phase detector 110 includes an input terminal ($I_1$) that is coupled to a node ($N_{10}$), another input terminal ($I_2$) that is coupled to a node ($N_{11}$), and an output terminal (O) that is coupled to a node ($N_{12}$) Integrator 120 includes an input terminal (I) that is coupled to node $N_{12}$ and an output node (O) that is coupled to a node ($N_{14}$). Stability filter 130 includes an input terminal (I) that is coupled to node $N_{12}$ and an output terminal (O) that is coupled to a node ($N_{15}$) Summer 140 includes an input terminal ($I_3$) that is coupled to node $N_{14}$, another input terminal ($I_4$) that is coupled to node $N_{15}$, and an output terminal (O) that is coupled to a node ($N_{16}$). Gain scalar 150 includes an input terminal (I) that is coupled to node $N_{16}$ and an output terminal (O) that is coupled to node ($N_{18}$). Voltage controlled oscillator 160 includes an input terminal (I) that is coupled to node $N_{18}$, and an output terminal (O) that is coupled to node $N_{11}$. Phase detector 110, gain scalar 150, and voltage controlled oscillator 160 are devices that are currently used throughout the industry and should be readily understood and available to one of ordinary skill in the art.

In operation, an input signal (Input) is coupled to node $N_{10}$ of phase-locked loop system 100. The input signal (Input) has an associated phase angle ($\Phi_{In}$). The phase detector (110) produces an error signal ($\Phi_{error}$) at node $N_{12}$ in response to a comparison between an input phase signal ($\Phi_{In}$) at node $N_{10}$ and a feedback phase signal ($\Phi_{FB}$) at node $N_{11}$. The feedback phase signal ($\Phi_{FB}$) corresponds to the phase angle of an oscillator signal ($V_{OSC}$) at node $N_{11}$. The error signal ($\Phi_{error}$) is an input signal for the integrator (120) and the stability filter (130). The integrator (120) produces an integration signal (I) at node $N_{14}$ in response to the error signal ($\Phi_{error}$). The stability filter (130) produces a filter signal ($\Phi_{error}$). The stability filter (130) produces a filter signal (S) at node $N_{15}$ in response to the error signal ($\Phi_{error}$). The summer (140) combines the integration signal and the filter signal, which is scaled by the gain scalar (150) to produce an output signal (Output). The output signal (Output) controls the voltage controlled oscillator (160).

The phase detector (110), for high-level purposes, can be represented by a transfer function gain factor $K_d$. For closed-loop phase correction purposes, $K_d$ is negative. The integrator (120) transfer function can be represented by $\omega_i/s$, where $\omega_i$ is the integrating time constant and "s" is the standard Laplace operator. The stability filter (130) is a passive low-pass filter having a transfer function of $\omega_s/(s+\omega_s)$. The gain scalar (150) has a transfer function $K_g$ that includes gain elements contributed by miscellaneous components in a practical PLL. The voltage controlled oscillator (160) has a transfer function of $K_o/s$.

To specify a PLL uniquely for circuit simulation purposes, only three frequency-dependent parameters are needed: ($\omega_k$, $\omega_i$, and $\omega_s$. The values of $\omega_i$ and $\omega_s$ are defined by the filter parameters mentioned above. The value of $\omega_k$ is the product of the K elements:

$$\omega_k = K_d \cdot K_g \cdot K_o$$

The addition of the gain scalar (150) $K_g$ provides a function holder for all miscellaneous gain components used in a practical PLL (e.g., clock pre-scalers, operational-amplifiers, etc . . . ) and gain compensation when the dc gain of the physical implementation of the stability filter (130) component is not unity. For practical purposes the three parameters are converted from angular velocity "$\omega$" to frequency "f" in Hz. The conversion relationship is as follows:

$$fX = \omega X/2\pi, \text{ where } X \text{ can be } K, I \text{ or } S$$

For scale normalization and ease of parameter comparison purposes, a fourth parameter $f_{mul}$, is introduced. This parameter is a frequency-multiplying factor such that the actual frequencies of the PLL parameters are $f_K \cdot f_{mul}$, $f_I \cdot f_{mul}$ and $f_S \cdot f_{mul}$. When specifying a filter, the value of $f_K$ is normalized to unity and $f_{mul}$ contains a factor for scaling $f_K$ to its actual value. Therefore, the ratios $f_K/f_I$ and $f_S/f_K$ can be directly represented by the values of $1/f_I$ and $f_S$ respectively.

Many PLL designs are designed and analyzed using different definitional terms and figures of merit. A common-modeling scheme is described below that provides a common framework with which PLL systems can be analyzed using a common set of terms and figures of merit.

Common Modeling Scheme

The common modeling scheme provides a method of comparing performance of different phase-locked loop topologies using a standardized set of coefficients. For example, there are two types of phase-locked loops that will be referred to in this specification. The present invention has identified that the superposition of two types of phase-locked loop topologies will provide superior performance in the form of reduced jitter peaking and acceptable roll-off.

The present invention is directed to a new class of phase-locked loop (PLL) system referred to as IS-PLL. The IS-PLL system includes a composite filter (170) that provides for enhanced jitter transfer characteristics with acceptable roll-off. The composite filter (170) includes the integrator (120) and a stability filter (130). The integrator (120) can be expressed mathematically as $\omega_I/s$, where $\omega_I$ corresponds to the integrating time constant and s corresponds to a Laplace operator ($s = j \cdot \omega$, $\omega$ is angular frequency in radians, and where $j = \sqrt{-1}$). The stability filter (130) can be expressed mathematically as $\omega_S/(s+\omega_S)$, where $\omega_S$ corresponds to the dominate pole of the filter. The loop transfer function of the IS-PLL is then given as:

$$H(s) = (s \cdot f_K \{f_S + f_I\} + f_K \cdot f_S f_I)/(s^3 + s^2 \cdot f_S + s f_K \{f_S + f_I\} + f_K \cdot f_S \cdot f_I) \quad \text{EQUATION 1}$$

The design coefficients ($f_K$, $f_S$, and $f_I$) represent design frequencies associated with the system components in the PLL. Thus, the design frequency associated with the gain scalar corresponds to $f_K$, while the integrator and the stability filter correspond to $f_I$ and $f_S$ respectively. System designers utilize PLL design coefficients ($f_K$, $f_S$, and $f_I$) to identify a range of operation of the PLL. That is, for different values of the PLL design coefficients ($f_K$, $f_S$, and $f_I$), there are corresponding values of the damping factor ($\zeta$). Additionally, $f_{-3dB}$ is the normalized $-3$ dB frequency corresponding to the $-3$ dB point of a given transfer function, and $f_{mul}$ is a scaling factor applied to scale $f_K$ to its actual value.

Upon determining the various sets of the PLL design coefficients ($f_K$, $f_S$, and $f_I$) that will provide a suitable damping factor ($\zeta$), the system designer can then implement one or more PLL systems. System transfer function (I) is generically a transfer function for any system that includes either, or both, an integrator and stability filter. The coefficients can be chosen to provide different types of phase-locked loop designs. This method is provided for in comparative purposes because there are various different ways used to describe the same PLL. The transfer function $H(s)$ can be utilized for a common modeling scheme.

Based upon the common modeling scheme, a first type of phase-locked loop system is referred to as an active-lag-lead phase-locked loop. This type of phase-locked loop system is also referred to as a second order proportional integral (PI) phase-locked loop. For sake of simplicity, this specification will refer to it as a PI-PLL. Utilizing the common modeling scheme transfer function above, the PI-PLL can be expressed as:

$$PI\text{-}PLL \equiv (f_K=1, f_I=\tfrac{1}{2}, f_S=\infty, f_{mul}=1)$$

The PI-PLL has a proportional path for controlling the loop stability. The PI-PLL has an integrator for tracking low frequency changes ($f_I=\tfrac{1}{2}$), and the proportional path represented as a passive low-pass filter having a roll-off frequency ($f_S=\infty$). Thus, the effective gain of the PI-PLL is unity for all frequencies [i.e., If ($\omega_S=\infty$, then $\omega_S/(s+\omega_S)=1$, where ($\omega = 2 \cdot \pi \cdot f$)]. When $f_I$ is ½, the loop-damping factor ($\zeta$) is:

$$\zeta = \tfrac{1}{2} \cdot \sqrt{(f_K/f_I)}$$

$$\zeta = 0.707$$

Based upon the common modeling scheme, a second type of phase-locked loop system is referred to as an RC lag phase-locked loop. This phase-locked loop system is also referred to as a one and one-half order phase-locked loop. For sake of simplicity, this specification will refer to it as a S-PLL hereinafter. Utilizing the common modeling scheme transfer function above, the S-PLL can be expressed as:

$$S\text{-}PLL = (f_K=1, f_I=0, f_S=2, f_{mul}=1)$$

The S-PLL does not contain an integrator for tracking low frequency changes ($f_I=0$), but does have a passive low-pass filter for controlling the loop stability ($f_S=2$). When $f_S$ is 2, the loop damping factor ($\zeta$) is:

$$\zeta = \tfrac{1}{2} \cdot \sqrt{(f_S/f_K)}$$

$$\zeta = 0.707$$

The common-model scheme S-PLL and PI-PLL will be discussed in more detail below. The analysis of an IS-PLL will also be discussed further below.

Discussion of the Common-model Scheme S-PLL

Figure 2:
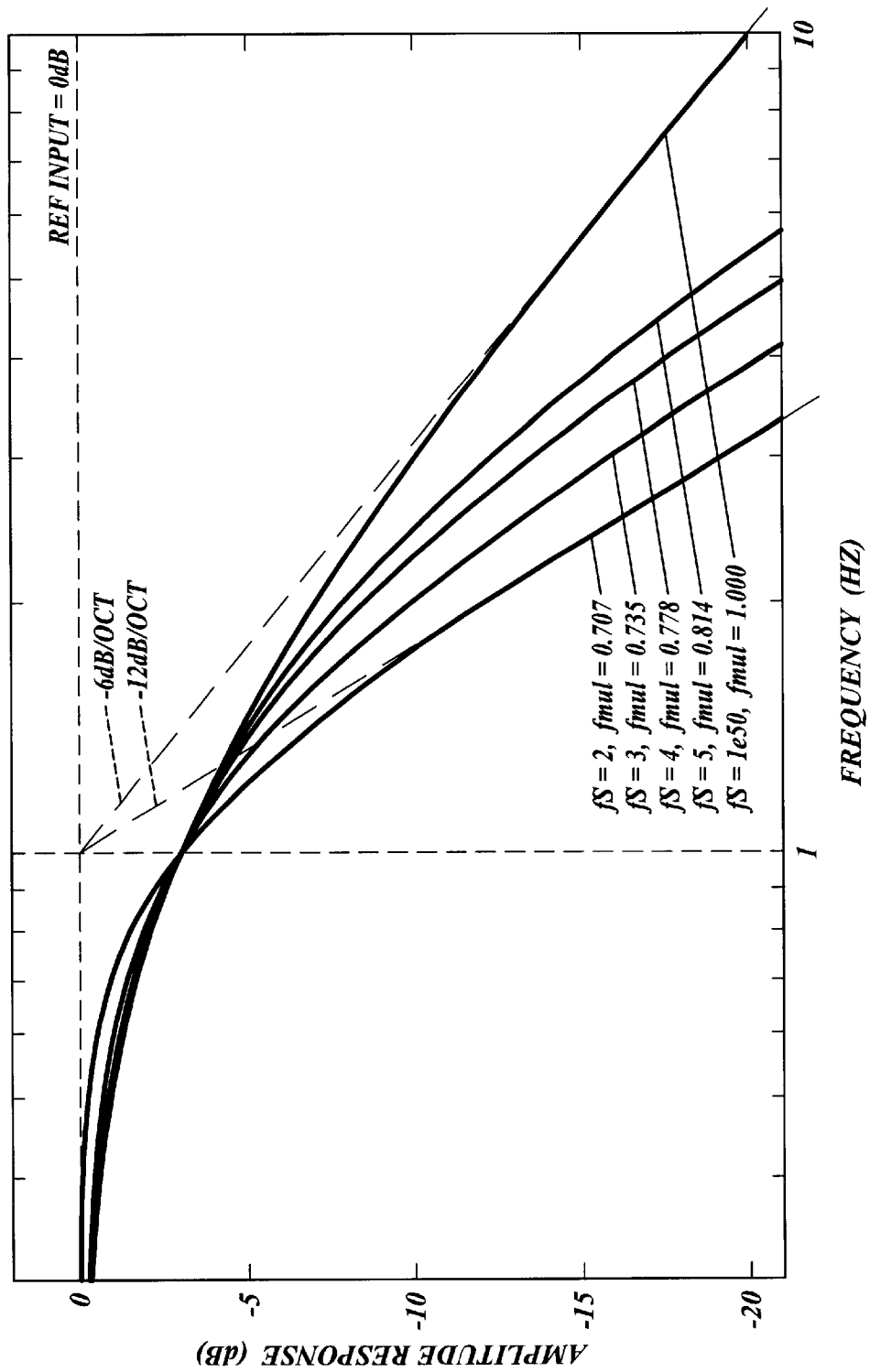
FIG. 2 illustrates output transfer characteristics of a simple RC-lag PLL.

FIG. 2 is an illustrative graph of transfer functions corresponding to various S-PLL systems. As shown in the figure, the S-PLL is a passive low pass filter response with a relatively flat pass band and very little jitter peaking. The damping factor for the S-PLL increases with increases in $f_S$ ($f_S=2$, damping factor $\zeta=0.707$; $f_S=4$, $\zeta=1$; $f_S=5$, $\zeta=1.118$). Notice that the increases in damping factor also results in a decrease in the roll-off to roughly $-6$ dB/octave. The loop stability of the S-PLL system is quantified by the damping factor. Since higher damping factors result in poor roll-off, a stable S-PLL system (with a sufficiently high damping factor) does not provide very good jitter performance. In addition, the S-PLL exhibits poor low frequency tracking due to the finite DC gain of the filter. The poor low frequency tracking impairs the use of the S-PLL in integrated circuit based systems, as the RC-lag PLL (S-PLL) cannot satisfy most application needs. The loop transfer function of a common model scheme S-PLL is given by:

$$H(s) = f_K \cdot f_S / (s^2 + s \cdot f_S + f_K \cdot f_S)$$

where $$fn^2 \equiv f_K \cdot f_S$$

$$2 \cdot \zeta \cdot fn \equiv f_S$$

$$\zeta = \tfrac{1}{2} \sqrt{(f_S/f_K)}$$

The loop transfer function of the S-PLL relies on the ratio of $f_S/f_K$ to determine the loop stability. For example, an S-PLL ($f_K=1$, $f_I=0$, $f_S=2$, $f_{mul}=1$) includes a loop that does not contain an integrator for tracking low frequency changes ($f_I=0$). The loop has a passive low-pass filter for controlling the loop stability ($f_S=2$). Specifically, when $f_S$ is 2, the loop damping factor ($\zeta$) is $0.5\sqrt{(f_S/f_K)}$ equaling 0.707.

The S-PLL has a favorable jitter transfer characteristics, and a reasonable amount of roll-off from $-6$ dB/Oct to $-12$ dB/Oct. However, the S-PLL does not have adequate low-frequency tracking. The present invention (IS-PLL) possesses favorable jitter transfer characteristics, and low-frequency tracking as will be discussed later.

The common-model scheme PI-PLL will be discussed in more detail as follows below.

Discussion of the Common-model Scheme PI-PLL

Figure 3:
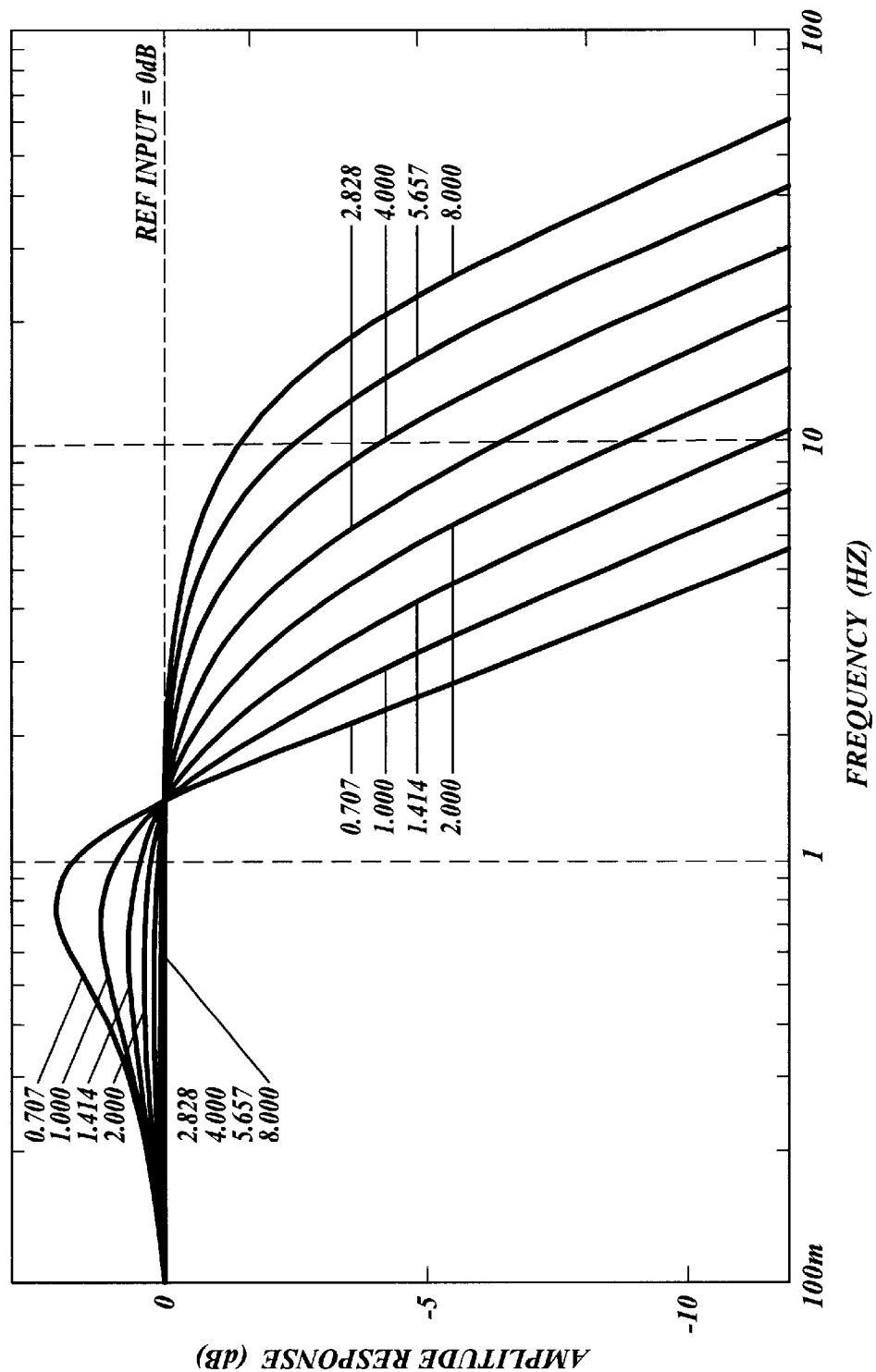
FIG. 3 illustrates output transfer characteristics of an active-lag-lead PLL (PI-PLL).

FIG. 3 is an illustrative graph of transfer functions corresponding to various PI-PLL systems. As shown in the figure, the PI-PLL includes an ideal integrator ($f_I=\frac{1}{2}$) for tracking low frequency changes. The damping factor for the PI-PLL increases with decreases in $f_I$ ($f_I=\frac{1}{2}$, damping factor $\zeta=0.707$; $f_I=\frac{1}{4}$, $\zeta=1$; $f_I=\frac{1}{8}$, $\zeta=1.414$; $f_I=\frac{1}{16}$, $\zeta=2$; $f_I=\frac{1}{32}$, $\zeta=2.828$; $f_I=\frac{1}{64}$, $\zeta=4$; $f_I=\frac{1}{128}$, $\zeta=5.657$; $f_I=\frac{1}{256}$, $\zeta=8$). Notice that the increases in the damping factor ($\zeta$) also results in a decrease in the roll-off. A slow roll-off in the transfer function will result in better jitter (lower peaking) performance than a fast roll-off. A PI-PLL system with a sufficiently low damping factor does not provide very good jitter performance (excessive peaking).

The loop transfer function of a common-model scheme PI-PLL is given by:

$$H(s)=(s \cdot f_K+f_K \cdot f_I)/(s^2+s \cdot f_K+f_K \cdot f_I)$$

where $$fn^2 \equiv f_K \cdot f_I$$

$$2 \cdot \zeta \cdot fn \equiv f_K$$

$$\zeta=\frac{1}{2}\sqrt{(f_K/f_I)}$$

The loop relies on the ratio of $f_K/f_I$ to determine its stability. For example, a PI-PLL ($f_K=1$, $f_I=\frac{1}{2}$, $f_S=\infty$, $f_{mul}=1$) includes a loop that has an integrator for tracking low frequency changes ($f_I=\frac{1}{2}$). The loop has a proportional path for controlling the loop stability. This path is replaced with a passive low-pass filter having a very high roll-off frequency ($f_S=\infty$). Thus, the effective gain of this block is unity for all frequencies (i.e. If $\omega_S=\infty$, then $\omega_S/(s+\omega_S)=1$). Specifically, when $f_I$ is $\frac{1}{2}$, the loop damping factor $\zeta$ is $\frac{1}{2}\sqrt{(f_S/f_K)}$ equaling 0.707.

Figure 5:
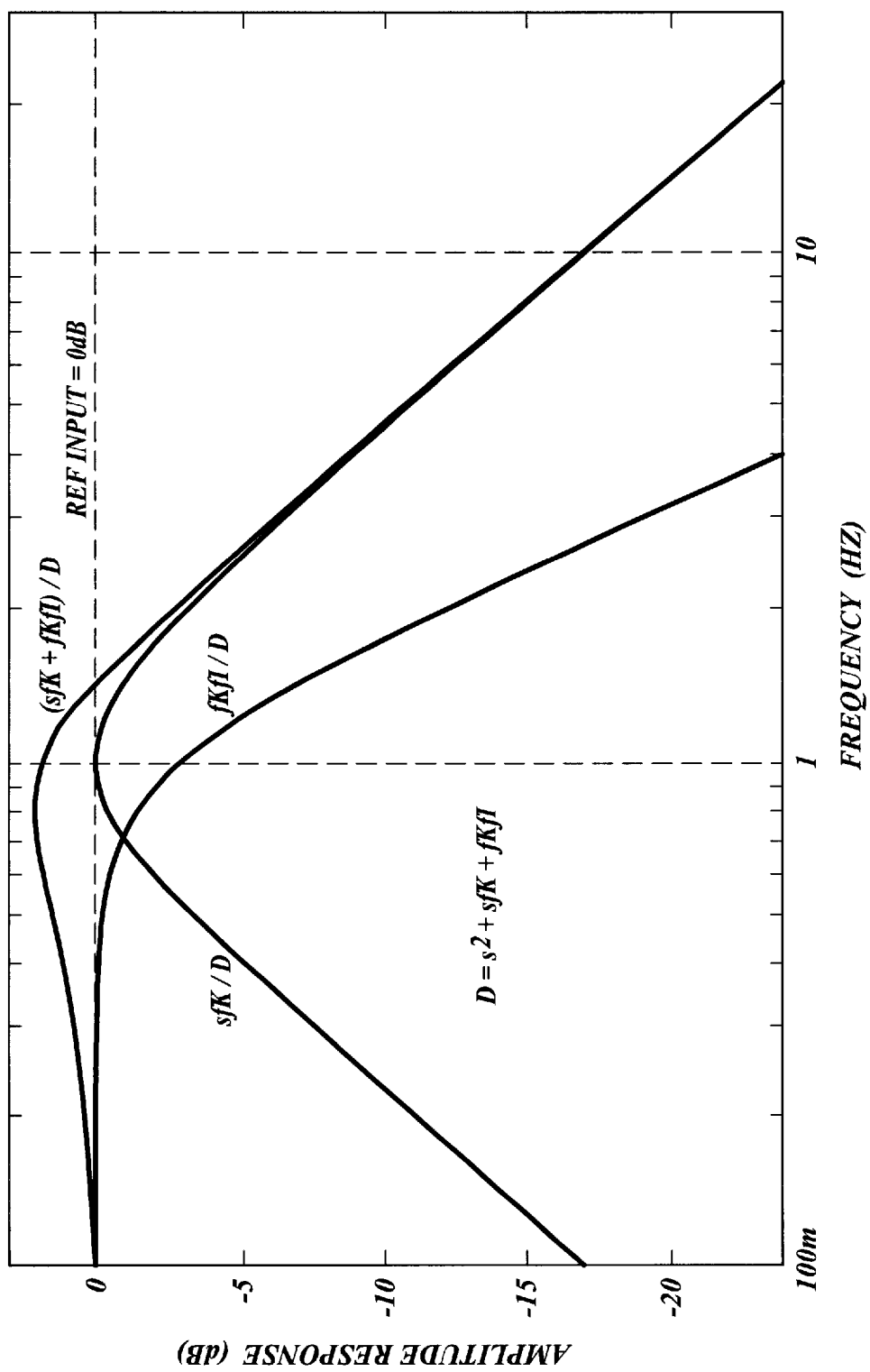
FIG. 5 is a more detailed illustration of the output transfer characteristics for a PI-PLL.

The PI-PLL suffers from poor jitter peaking response. The poor jitter peaking response is predominately due to the numerator of the transfer function containing the term "$s \cdot f_K$." This term creates a response peaking near the loop's natural frequency fn, as shown by the peaking in FIG. 5. Decreasing $f_I$ also increases the loop's damping factor $\zeta$. Although a high damping factor is desirable to reduce jitter peaking, a high damping factor makes the loop sluggish, which affects low frequency tracking performance and acquisition speed. Jitter peaking is illustrated in FIG. 3, where the amplitude response exceeds 0 dB.

A PI-PLL exhibits poor high frequency roll-off characteristics. The poor roll-off rate is also due to the term ($s \cdot f_K$) in the numerator of the transfer function equation, which is created by the proportion-path within the loop filter. The term ($s \cdot f_K$) has a roll-off rate of –6 dB/Octave as shown in FIG. 2. This roll-off dominates the loop response when input frequencies are higher than the natural frequency (fn) of the loop. This rate is similar to that of a first-order loop.

Figure 4:
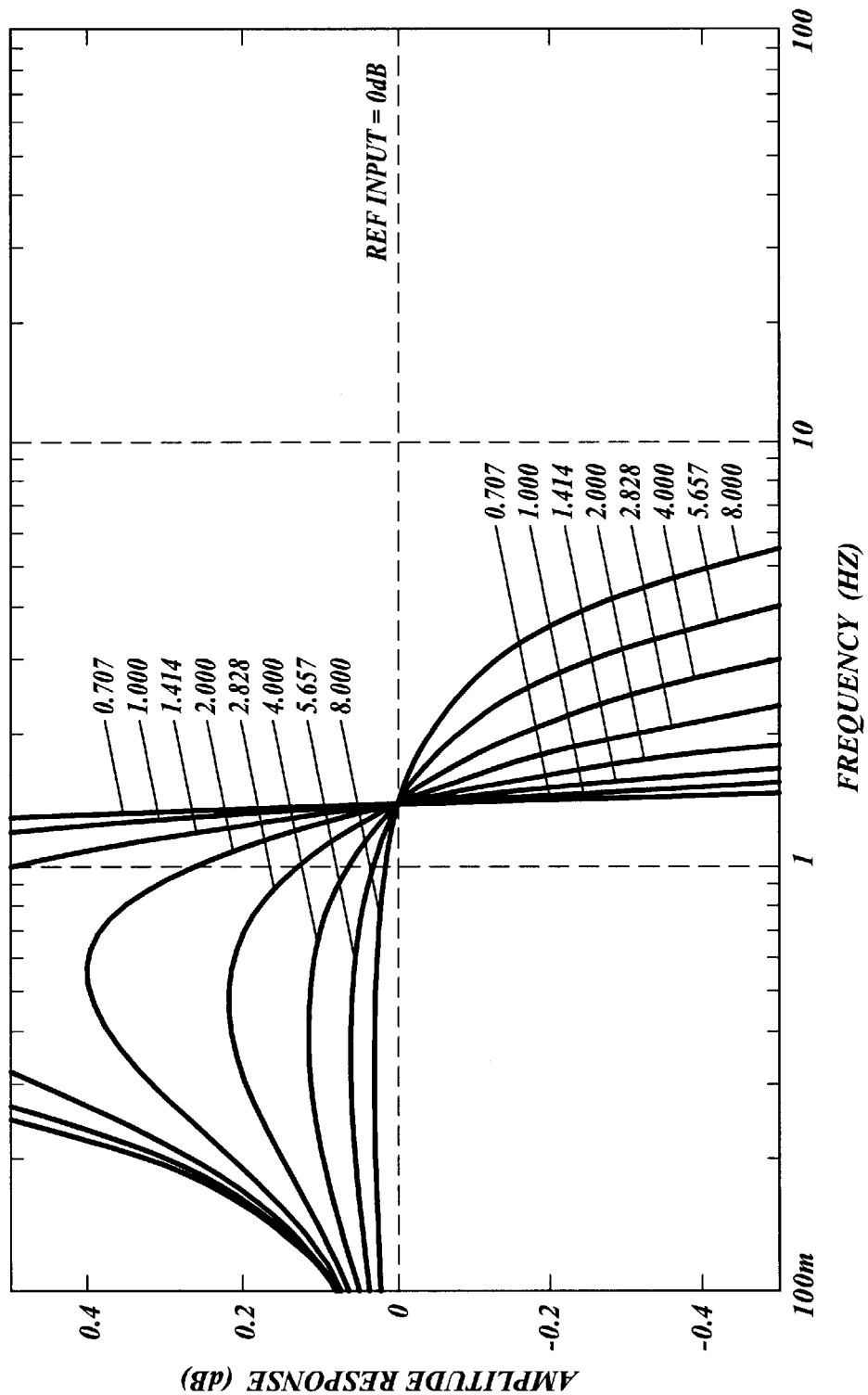
FIG. 4 is a more detailed illustration of the output transfer characteristics shown in FIG. 3.

FIG. 4 further illustrates a detailed view of output transfer characteristics for a PI-PLL with various coefficients. In PLL designs, where dominating jitter sources result from input reference signals, charge-pumps, or loop filters, having a –12 dB/Octave roll-off rate is appropriate for meeting a tight PLL jitter specification. On the contrary, for systems with high VCO noise, this will create adverse effects. FIGS. 3 and 4 illustrate that the PI-PLL exhibits unacceptable jitter transfer characteristics when the damping factor $\zeta$ is low. That is, for lower values of the jitter transfer characteristics exhibit high peaking.

The common-model scheme IS-PLL will be discussed in detail below followed by a discussion of the criteria for designing an IS-PLL.

Discussion of the Common-model Scheme IS-PLL

Utilizing the common modeling scheme, the present invention phase-locked loop system has no classical equivalent type. The IS-PLL instead uses a combination of an integrator and a stability filter to provide improved jitter performance, while maintaining stability with a second order rolloff as will be discussed.

Analysis of the transfer function for an IS-PLL is accomplished by using superposition. That is, the transfer function [H(s), equation 1] can be analyzed at low frequencies to determine low frequency tracking (DC gain), and analyzed again at high frequencies to determine high frequency gain (roll-off).

Recall that the PLL system shown in FIG. 1 has a transfer function given by:

$$H(s)=(s \cdot f_K \cdot \{f_S+f_I\}+f_K \cdot f_S \cdot f_I)/(s^3+s^2 \cdot f_S+s \cdot f_K \cdot \{f_S+f_I\}+f_K \cdot f_S \cdot f_I)$$

For input frequencies much smaller than $f_S$, the transfer function [H(s)] is similar to that of a proportional integrator phase-locked loop (PI-PLL), and H(s) is approximated as $H_{LO}(s)$, where:

$$H_{LO}(s) \approx (s \cdot f_K+f_K \cdot f_I)/(s^2+s \cdot f_K+f_K \cdot f_I)$$

Similarly, for input frequencies that are much greater than $f_I$, the transfer function [H(s)] is similar to that of an RC-lag PLL (S-PLL), and H(s) is approximated as $H_{HI}(s)$, where:

$$H_{HI}(s) \approx f_K \cdot f_S/(s^2+s \cdot f_S+f_K \cdot f_S)$$

Because there are two different transfer functions for each of the two different frequency bands, there are two natural frequencies ($fn_{LO}$ and $fn_{HI}$) and two damping factors ($\zeta_{LO}$ and $\zeta_{HI}$) in the system:

For input frequencies<<$f_S$:

$$fn_{LO}^2=f_K \cdot f_I,$$

$$\zeta_{LO}=\frac{1}{2}\sqrt{(f_K/f_I)}$$

For input frequencies>>$f_I$:

$$fn_{HI}^2=f_K \cdot f_S,$$

$$\zeta_{HI}=\frac{1}{2}\sqrt{(f_S/f_K)}$$

where, fn is the loop natural frequency, $\zeta$ is the damping factor.

For jitter peaking and high frequency roll-off reasons, the ratio of $f_K/f_I$ is chosen to be (typical range: 32 to 512) much larger than that of $f_S/f_K$ (typical range: 2 to 5), so the loop is more sensitive to $fn_{HI}$ and $\zeta_{HI}$. Therefore, $fn_{HI}$ and $\zeta_{HI}$ are the primary loop parameters and $fn_{LO}$ and $\zeta_{LO}$ are the secondary loop parameters. The result is that the passive low-pass filter $\omega_S/(s+\omega_S)$ is the primary loop filter while the integrator $\omega_I/s$ is the secondary loop filter.

An example IS-PLL can be expressed as:

$$IS\text{-}PLL \equiv (f_K=1, f_I=\frac{1}{256}, f_S=2, f_{mul}=1)$$

The IS-PLL has an integrator for tracking low frequency changes ($f_I=\frac{1}{256}$). The IS-PLL also includes a passive low-pass filter for controlling the loop stability ($f_S$=2). In this example, the loop-damping factor ($\zeta$) is given by:

$$\zeta = \tfrac{1}{2} \cdot \sqrt{(f_S/f_K)}$$

$$\zeta = 0.707$$

An IS-PLL is designed by carefully selecting the primary and secondary loop parameters as will be discussed in more detail below.

Criteria for Selecting the Secondary Loop Parameters: ($f_K/f_I$)

The secondary loop parameters ($fn_{LO}$ and $\zeta_{LO}$) are determined by the parameters $f_K$ and $f_I$ when the input frequency is much less than $f_S$, as previously discussed above. The selection of the secondary loop parameters is determined by choosing a value for $f_K/f_I$ that corresponds to a desired jitter peaking response. For example, when the value of $f_K/f_I$ is in the range from 32 to 512, the jitter peaking response is in the range from 0.22 dB to 0.03 dB, where $\zeta$=2.828 to $\zeta$=8.0. Although this tweaking technique cannot eliminate the peaking effect totally, it is a practical solution that minimizes jitter peaking.

The secondary loop parameters are selected such that the poles in the corresponding transfer equation are relatively far from the poles in the transfer equation for the primary loop. By separating these poles sufficiently far apart, the poles do not interact a significant amount and design of the filters is simplified. In one example, the poles are located at least a factor of 64 apart from one another. In another example, the poles are located at least a factor of 200 apart from one another.

The selection of the primary loop parameters in the IS-PLL are considerably more involved as will become apparent from the discussion below.

Criteria for Selecting the Primary Loop Parameters: ($f_S/f_K$)

The primary loop parameters ($fn_{HI}$ and $\zeta_{HI}$) are determined by the parameters $f_S$ and $f_K$ when the input frequency is much greater than $f_I$, as previously discussed above. The selection of the primary loop parameters is determined by choosing a value for $f_S/f_K$ that results in a low-pass filter response that provides adequate rolloff as is necessary in the IS-PLL system. The primary loop parameters may also be referred to as high frequency parameters since the input frequency is considered high with respect to $f_I$.

When selecting the primary loop parameters the selection criteria are based on a classical low pass filter design. A second order low-pass filter transfer equation is typically given as:

$$H(s) = \text{freq}^2/(s^2 + s \cdot \text{freq}/Q_{factor} + \text{freq}^2)$$

This equation has the same form as the equation $H_{HI}(s)$ for an IS-PLL for input frequencies that are much greater than $f_I$. Using the common PLL modeling scheme, the design parameters can be chosen such that different classical filter types may be used for the low-pass filter by choosing the appropriate coefficients.

For example, the low pass filter is designed as a second-order Butterworth low-pass filter (maximally flat amplitude response) when the parameters are:

$$f_K = 1, f_I = 0, f_S = 2, f_{mul} = 0.707, \text{ and}$$

$$\zeta = 0.707, f_{-3dB} = 1.0$$

In this example, utilizing the values for the coefficients ($f_K$, $f_I$, $f_S$, and $f_{mul}$) results in the given values for $\zeta$ and $f_{-3dB}$ (again, $f_{-3dB}$ is the normalized -3 dB frequency corresponding to the -3 dB point of a given transfer function, and $f_{mul}$ is a scaling factor applied to scale $f_K$ to its actual value). Therefore, the ratios $f_K/f_I$ and $f_S/f_K$ have the values $1/f_I$ and $1/f_S$ respectively.

In another example, the low pass filter design is a second-order Bessel low-pass filter (maximally flat delay response) when the parameters are:

$$f_K = 1, f_I = 0, f_S = 3, f_{mul} = 0.735, \text{ and}$$

$$\zeta = 0.866, f_{-3dB} = 1.0$$

These filter responses are monotonic and exhibit no jitter peaking effect. If the value of $f_S$ is set to less than 2, then the filter response has peaking and the filter class is similar to that of a Chebyshev type. If the value of $f_S$ is set to higher than 3, then the filter response is monotonic and exhibits no jitter peaking effect. However, when the value of $f_S$ is very large or close to infinity, the filter loses all of its second-order effect and operates as a first-order filter.

The performance of the primary loop transfer function will be discussed in detail as follows below.

Performance of the Primary Loop Transfer Function

In general, the primary loop transfer functions discussed above are low pass filters that have a roll-off rate of -12 dB/Octave in the stop band. When $f_S$ has a value higher than 5, the high frequency attenuation characteristic degrades more rapidly. For systems where minimum peak-to-peak phase jitter is of importance, such as in a timing recovery loop, then the value of $f_S$ should be less than 5. This is based on the assumption that the output jitter is dominated by components less than 5 (in Hz, note that the $f_{-3dB}$ frequency of the filter is normalized to 1 Hz). When frequencies are higher than 5, attenuation is high (more than 20 dB). As a result, these frequency components do not contribute much to the total jitter output.

For example, when the frequency is 2 Hz and $f_S$ is 2, the attenuation is -12.3 db. The attenuation drops to -7.8 dB when $f_S$ is 5, while it is almost equivalent to the -7.0 dB attenuation when $f_S$ is $\infty$. Note that as $f_S$ approaches $\infty$, the filter behaves like a first-order filter. Hence, in order to achieve high rejection at high frequencies, the value of $f_S$ should be small, or less than 5.

The present invention (IS-PLL) filter scheme may be used in digital loops where frequency-poles can be positioned accurately, as well as in analog implementations with advanced processing techniques. Therefore, it is possible to further limit the range of $f_S$ for obtaining a narrow performance distribution. A consideration for having a large $f_S$, is to improve phase error response ($\Phi_{error}$) and Jitter Tolerance.

An example of an IS-PLL ($f_K=1$, $f_I=\tfrac{1}{256}$, $f_S=2$, $f_{mul}=1$), includes a loop having an integrator for tracking low frequency changes ($f_I=\tfrac{1}{256}$) and a loop having a passive low-pass filter for controlling the loop stability ($f_S=2$). Specifically, when $f_S$ is 2, the loop damping factor $\zeta$ is 0.5 sqrt($f_S/f_K$) equaling 0.707.

The performance of the IS-PLL provides improved jitter transfer characteristics, as well as a sufficient roll-off for high frequency stability. For illustrative purposes, the performance of the IS-PLL will be compared to a PI-PLL in detail as follows below.

Comparison of the IS-PLL and the PI-PLL

Figure 6:
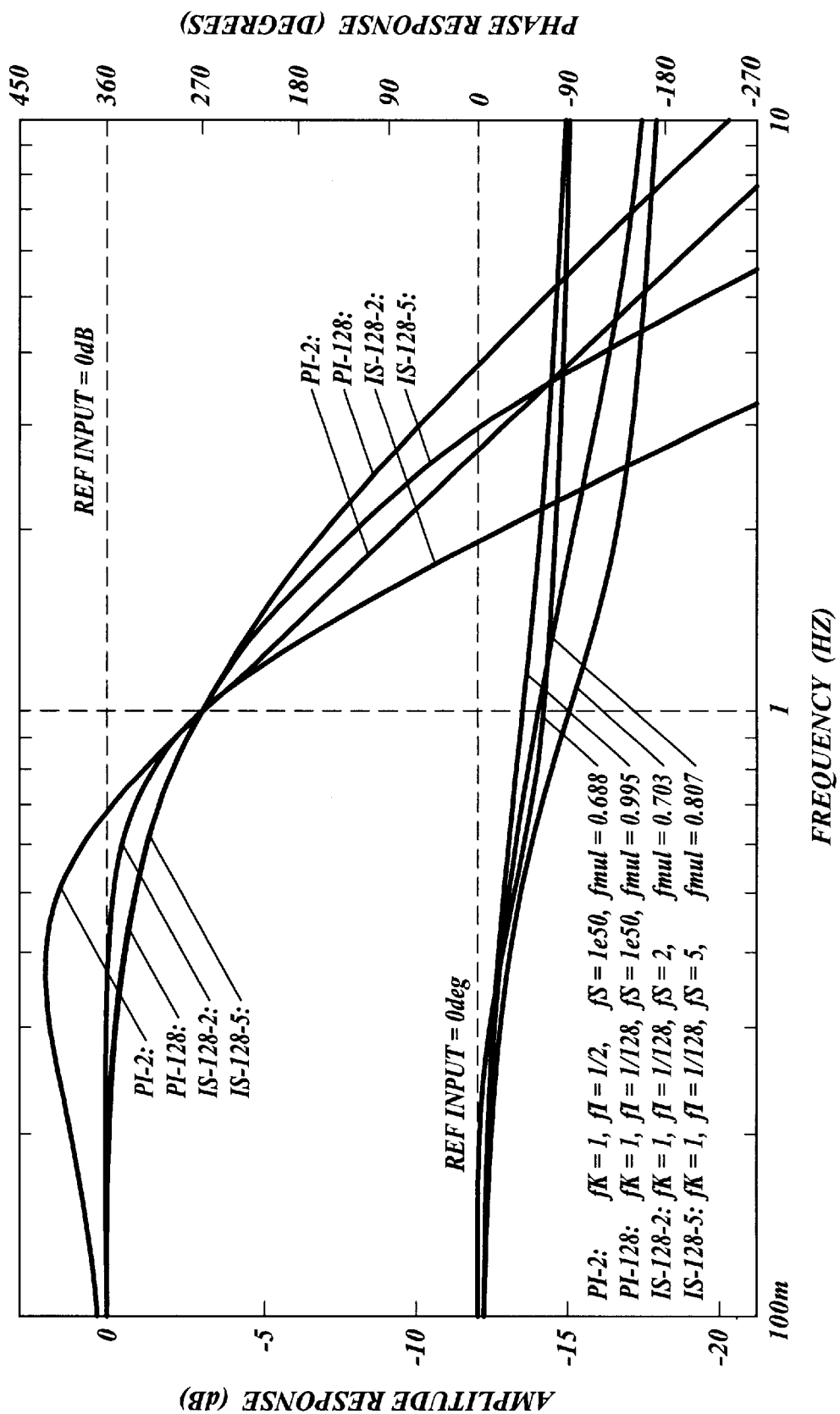
FIG. 6 illustrates a performance comparison between the present invention and an active-lag-lead PLL (PI-PLL).
Figure 7:
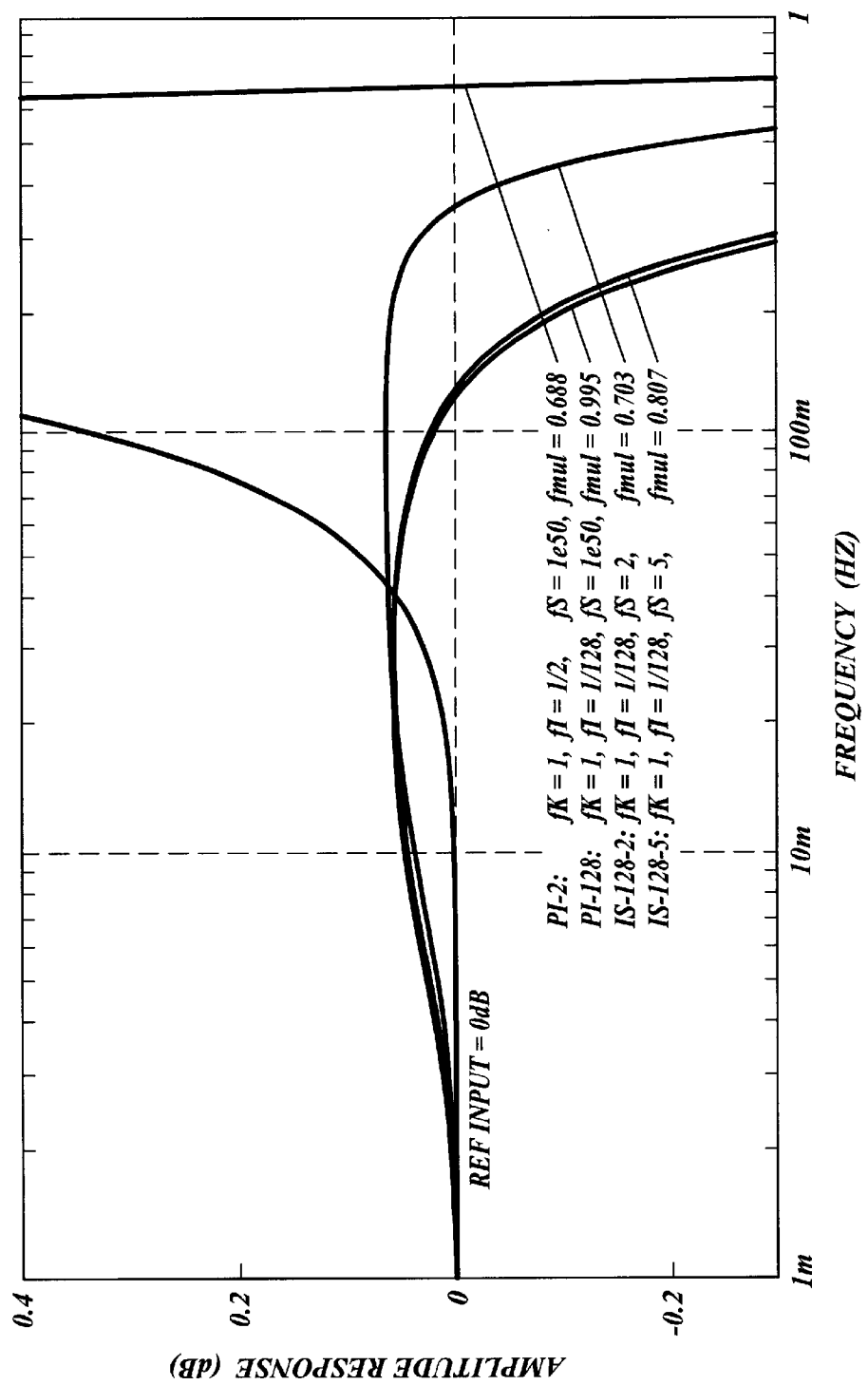
FIG. 7 is a more detailed illustration of the performance comparison shown in FIG. 5.

FIGS. 6 and 7 illustrate output transfer characteristics of an active-lag-lead PLL (PI-PLL) and output transfer characteristics of a composite PLL (IS-PLL) for various coefficients. The figures allow comparison between the present invention (IS-PLL) and current technology (PI-PLL). As can be seen in the figures, the PI-PLL model (PI-2) exhibits acceptable roll-off, but has poor jitter transfer characteristics. Conversely, the PI-PLL model (PI-128) exhibits excellent jitter transfer characteristics but has poor roll-off. As described above and illustrated in the figures, the PI-PLL system has great difficulty achieving acceptable jitter transfer characteristics and acceptable roll-off concurrently. However, the present invention (IS-PLL) does achieve acceptable jitter transfer characteristics and acceptable roll-off over a wide range of coefficients. As can be seen in the figures, the IS-PLL model (IS-128-5) exhibits acceptable roll-off, and has excellent jitter transfer characteristics. Additionally, the IS-PLL model (IS-128-2) exhibits acceptable jitter transfer characteristics and has excellent roll-off. Notice that both of the IS-PLLs shown in FIGS. 6 and 7 have jitter peaking that is below 0.1 dB, while the PI-PLL (PI-2), with acceptable roll-off, peaks above several dB.

A realized PLL system often has undesirable poles and/or zeros in the transfer function that may degrade the overall performance of the system. For illustrative purposes, the performance of an IS-PLL system will be compared to a PI-PLL system that is subject to non-ideal effects as follows below.

Comparison of the IS-PLL to Non-ideal Effects in the PI-PLL

The PI-PLL model, as described above, is an "ideal" model and does not represent real conditions that exert influence on the system such as parasitic capacitance. When implementing a PI-PLL with traditional analog processing techniques, the actual outcome can be an "active-lag-lead-lag PLL." This is due to the parasitic high frequency poles of the physical circuit elements, which cause the PI-PLL to become a much higher order loop. Since these parasitic high order poles are unavoidable physical impairments and their values vary, many PLL references have classified these poles as unwanted poles.

A commonly used model of the "active-lag-lead-lag" filter consists of three passive components: a resistor $R_2$ and two capacitors C and $C_3$ ($C_3$ across $R_2+1/sC$). The basic "lead" function is provided by the combination of $R_2$ and C. The "lag" function is provided by $C_3$, which created the unwanted high frequency pole. A current source driving the filter network contributes to the "active-lag" function.

To minimize the effects of these high order poles, many PLL references recommend placing these poles at least ten times higher than the loop's bandwidth. By doing this, the loop can be modeled and analyzed with the simple second-order PI-PLL equations. Consequently, third order analysis of "active-lag-lead-lag PLL" systems is often not provided in most references.

Nevertheless, several references have indicated that the parasitic poles in the PI-PLL can be used for noise smoothing purposes. Recommended action includes adding a pole to the loop such that $\tau_3$ is chosen about $\tau_2/10$ (if $\omega_2=1/\tau_2$, $\omega_3=1/\tau_3$, then $\omega_3>10\omega_2$). Other PLL references have made similar suggestions and thus this method has become the "rule of thumb" for designing PLLs. However, this rule makes the loop under-damped or unstable when the loop is designed with a small $\omega_2$ in a low jitter peaking application. Because of the drawback, some references have suggested to relate these two values to K, so $\omega_3$ is always larger than K:

$\omega_2=K/4$, and $\omega_3=4K$

The transfer function of the "three-component resistor-capacitor-capacitor" network is similar to the filter transfer function of the IS-PLL filter. These functions can be represented by a "two-pole-one-zero" equation:

$$H(s)=A(s+\omega_2)/s(s+\omega_3)$$

The values of A, $\omega_2$ and $\omega_3$ are depicted by:

| Resistor-Capacitor-Capacitor network | IS-PLL using the Common PLL model |
| --- | --- |
| $A = 1/R_2C_3$ | $A = \omega_1 + \omega_S$ |
| $\omega_2 = 1/R_2C$ | $\omega_2 = \omega_1 \cdot \omega_S/(\omega_1 + \omega_S)$ |
| $\omega_3 = 1/R_2C_3 + \omega_2$ | $\omega_3 = \omega_S$ |

An example for constructing a filter such that $H(s)=A(s+1)/s(s+10)$, i.e., $\omega_3=10\omega_2$:

| If | | If | |
| --- | --- | --- | --- |
| | $R_2 = 1$ | | $\omega_1 = 10/9$ |
| | $C = 1$ | | $\omega_S = 10$ |
| | $C_3 = 1/9$ | | |
| Then | | then | |
| | $A = 9$ | | $A = 10/9 + 10 + 100/9$ |
| | $\omega_2 = 1$ | | $\omega_2 = (10/9 * 10)/(100/9) = 1$ |
| | $\omega_3 = 9 + 1 = 10$ | | $\omega_3 = 10$ |
| | $H(s) = 9 (s + 1)/s (s + 10)$ | | $H(s) = (100/9) (s + 1)/s(s + 10)$ |

Note that the values of the poles and zero are identical, but the gain values "A" are different.

The active-lag-lead-lag PLL (non-ideal PI-PLL) is problematic because physical implementations create unwanted parasitic high frequency poles and these poles affect loop stability. The integrator is designed as the dominant pole in the PI-PLL. In practice, the poles are placed approximately a factor of ten apart from one another to minimize the interaction between the poles. By placing the poles far apart, the third-order loop filter equation in the PI-PLL may be approximated as a second-order equation. However, various system parameters in the PI-PLL are not well controlled such as, for example, the location of the parasitic poles and the loop gain of the system. Thus, the second order approximation of the loop transfer function in the PI-PLL is not precise. The IS-PLL does not suffer from the same ailments of the PI-PLL and can be more easily realized.

SUMMARY

The present invention provides for a simplified design using a new approach to PLL design since the IS-PLL utilizes the primary filter $\omega_S/(s+\omega_S)$ to set the dominant pole $f_S$ of the loop. The location of this pole is based on the classical filter theory for obtaining the flattest transfer characteristics and the steepest high-frequency attenuation slope. Furthermore, the placement of $f_I$ should be far away from $f_K$ such that this secondary low frequency pole $f_I$ does not interact with the dominant high frequency pole $f_S$. These are the recommended values:

$f_K/f_I$: 32 to 512

$f_S/f_K$: 2 to 5

As aforementioned, using small values for $f_S/f_K$ greatly improves the loop's high frequency attenuation characteristics. This is extremely useful in smoothing out inherent digital noise in low-cost, low-resolution digital designs. The low-pass filter acts like a "code-regulator," which redistributes high value digital words over a longer period of time at a low value rate. However, this effect is not apparent by simply inspecting the conventional frequency or time domain plots.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus for reducing jitter in a phase-locked loop circuit, comprising:
   (a) a phase detector circuit that is arranged to produce an error signal in response to a phase difference between an input signal and a feedback signal;
   (b) a composite filter circuit that is arranged to produce a composite signal that is in response to the phase difference, the composite filter circuit further comprising an integrator circuit and a stability filter circuit;
   (c) a gain circuit that is arranged to produce an output signal in response to the composite signal, wherein the output signal corresponds to a scaled version of the composite signal; and
   (d) an oscillator circuit that is arranged to produce an oscillator signal in response to the output signal, wherein the oscillator signal includes a corresponding phase that is employed as the feedback signal to the phase detector circuit so that jitter is reduced.

2. The apparatus of claim 1, wherein the gain circuit further comprises a scalar for producing the output signal, wherein the scalar is adjustable in response to the composite signal.

3. The apparatus of claim 1, wherein the integrator circuit includes a filter parameter that is adjustable in response to the error signal.

4. The apparatus of claim 1, wherein the stability filter circuit includes a filter parameter that is adjustable in response to the error signal.

5. The apparatus of claim 4, wherein the filter parameter of the stability filter circuit is selected to reduce peaks in the composite signal when the error signal changes.

6. The apparatus of claim 3, wherein the filter parameter of the integrator circuit is selected to provide a roll off frequency for the composite signal.

7. The apparatus of claim 1, wherein the integrator circuit provides improved tracking of a direct current (DC) component of the composite signal.

8. The apparatus of claim 1, wherein the composite filter circuit is represented by a transfer function:

$$H(s) = (s \cdot f_K \{f_S + f_I\} + f_K \cdot f_S \cdot f_I)/(s^3 + s^2 \cdot f_S + s \cdot f_K \{f_S + f_I\} + f_K \cdot f_S \cdot f_I).$$

9. The apparatus of claim 8, wherein $f_K$ is a filter parameter representing a gain coefficient that is a product of each gain associated with the integrator circuit, the stability filter circuit, and the gain circuit, and wherein $f_S$ is a filter parameter representing the stability filter circuit and $f_I$ is another filter parameter representing the integrator circuit.

10. The apparatus of claim 8, wherein the ratio of $f_K/f_I$ is from about 32 to about 512.

11. The apparatus of claim 8, wherein the ratio of $f_S/f_K$ is from about 2 to about 5.

12. A method for improving jitter transfer characteristics in a phase-locked loop circuit, comprising:
   (a) detecting a phase difference between an input signal and an oscillating signal and producing an error signal in response to the phase difference between the input signal and the oscillating signal;
   (b) filtering the error signal to produce a composite signal based on the filtered error signal, wherein the error signal is integrated and filtered by a low pass filter;
   (c) scaling an output signal in response to the composite signal; and
   (d) producing the oscillating signal in response to the output signal, wherein the jitter transfer characteristics are improved for the phase locked loop circuit.

13. The method of claim 12, wherein scaling the output signal further comprises employing an adjustable scalar to produce the output signal.

14. The method of claim 12, further comprising selecting a filter parameter for the low pass filter that reduces peaks in the composite signal when the error signal changes.

15. The method of claim 12, further comprising selecting a filter parameter of the integration of the error signal, the filter parameter providing a roll off frequency for the composite signal.

16. The method of claim 12, the filtering of the error signal is represented by a transfer function:

$$H(s) = (s \cdot f_K \{f_S + f_I\} + f_K \cdot f_S \cdot f_I)/(s^3 + s^2 \cdot f_S + s \cdot f_K \{f_S + f_I\} + f_K \cdot f_S \cdot f_I).$$

17. The method of claim 16, wherein $f_K$ is a filter parameter representing a gain coefficient that is a product of each gain associated with the integration, the low pass filter, and the gain circuit, and wherein $f_S$ is a filter parameter representing the low pass filter and $f_I$ is another filter parameter representing the integration.

18. The method of claim 12, wherein the integration improves tracking of a direct current (DC) component of the composite signal.

19. The method of claim 16, wherein the ratio of $f_K/f_I$ is from about 32 to about 512 and the ratio of $f_S/f_K$ is from about 2 to about 5.

20. An apparatus for improving jitter transfer characteristics in a phase-locked loop circuit, comprising:
   (a) a means for detecting a phase difference between an input signal and an oscillating signal;
   (b) a means for producing an error signal in response to the phase difference between the input signal and the oscillating signal;
   (c) a means for filtering the error signal with an integrator and a stability filter and producing a composite signal based on the filtered error signal;
   (d) a means for scaling the composite signal to produce an output signal; and
   (e) a means for producing the oscillating signal in response to the output signal, wherein jitter transfer characteristics are improved.

* * * * *

UNITED STATES PATENT AND TRADEMARK OFFICE
CERTIFICATE OF CORRECTION

PATENT NO. : 6,697,445 B1
DATED : February 24, 2004
INVENTOR(S) : Wong

It is certified that error appears in the above-identified patent and that said Letters Patent is hereby corrected as shown below:

Column 8,
Line 3, "lower values of the jitter transfer" should read -- lower values of $\zeta$, the jitter transfer --.

Signed and Sealed this

First Day of June, 2004

JON W. DUDAS
*Acting Director of the United States Patent and Trademark Office*